United States Patent [19]

Shintaku

[11] 4,189,673
[45] Feb. 19, 1980

[54] PEN-SHAPED PRECISION MULTI-LEVEL CURRENT MODE LOGIC TEST PROBE

[75] Inventor: Ken Shintaku, Oreland, Pa.

[73] Assignee: Burroughs Corporation, Detroit, Mich.

[21] Appl. No.: 901,347

[22] Filed: May 1, 1978

[51] Int. Cl.² .................... G01R 19/16; G01R 31/02
[52] U.S. Cl. .................................. 324/133; 324/72.5
[58] Field of Search ............... 324/122, 73 R, 133, 324/72.5; 340/661–663

[56] References Cited

U.S. PATENT DOCUMENTS

| | | | |
|---|---|---|---|
| 3,573,614 | 4/1971 | Wittbrodt | 324/133 X |
| 3,796,951 | 3/1974 | Joseph | 324/133 X |
| 3,838,339 | 9/1974 | Brandt | 324/133 |
| 3,903,470 | 9/1975 | Mirabile et al. | 324/133 X |
| 3,927,571 | 12/1975 | Athey | 340/661 |
| 3,959,791 | 5/1976 | Takahashi et al. | 324/133 X |
| 3,961,256 | 6/1976 | Gaskell et al. | 324/122 X |
| 3,969,672 | 7/1976 | Wallander et al. | 324/133 |
| 3,979,657 | 9/1976 | Yorksie | 340/661 X |
| 4,004,220 | 1/1977 | Kerber et al. | 324/122 X |
| 4,020,414 | 4/1977 | Paredes | 324/133 X |

*Primary Examiner*—Gerard R. Strecker
*Attorney, Agent, or Firm*—Kevin Peterson; Edmund M. Chung; Leonard C. Brenner

[57] ABSTRACT

A pin-shaped handheld test probe particularly adapted to current mode logic levels indicates through a plurality of visual indicators HIGH, LOW, MIDRANGE, OPEN and SUPPLY VOLTAGE logic levels. Each visual indicator is controlled by the output of at least one comparator amplifier having one of two inputs resistively connected to a testing point and the other input resistively coupled to a stable reference voltage level generated by a zener stabilized precision resistor ladder network. The testing point is voltage biased to give an indication of OPEN when the test probe is attached to a pin or point which is unconnected.

8 Claims, 3 Drawing Figures

& 1,189,673

PEN-SHAPED PRECISION MULTI-LEVEL CURRENT MODE LOGIC TEST PROBE

BACKGROUND OF THE PRESENT INVENTION

The present invention in the field of solid state digital test and debugging instrumentation relates more particularly to a handheld voltage indicating test probe for current mode logic circuitry.

In the prior art visually indicating handheld test probes have been developed and adapted to sense binary voltage levels. Principally circuits have been developed to sense high level voltage excursions such as those occurring in TTL digital circuitry, see for example, U.S. Pat. No. 3,838,339, issued to W. F. Brandt on Sept. 24, 1974.

In current mode logic circuitry voltage excursions between HIGH and LOW are measurable in the few hundreds of millivolts. Furthermore, it is useful in testing and debugging current mode logic circuitry to know not only whether a test point is HIGH or LOW but also whether a given logic pin is at a MIDRANGE level, OPEN (a valid input condition for CML), or at SUPPLY VOLTAGE level.

OBJECTS AND SUMMARY OF THE INVENTION

It is an object of the present invention to provide a pen-shaped handheld test probe adapted for testing and debugging current mode logic circuitry.

It is another object of the present invention to provide a test probe for current mode logic circuitry which indicates visually, HIGH, LOW, MIDRANGE, OPEN and SUPPLY VOLTAGE conditions.

It is still another object of the present invention to provide a test probe for current mode logic circuitry having stable precision reference and indicating voltage levels while operating from an unregulated voltage supply.

The above and other objects of the present invention are realized through a current mode logic test probe having a test point and a plurality of visual indicators for indicating when the test point is at HIGH, LOW, MIDRANGE, OPEN and SUPPLY VOLTAGE levels. Each visual indicator is controlled by the output of at least one comparator amplifier having one of two inputs resistively connected to the test point and the other input resistively coupled to a stable reference voltage level generated by a zener stabilized precision resistor ladder network. The test point is voltage biased to give an indication of OPEN when the test probe is attached to a pin or point which is unconnected.

The system configuration and operational details given above have been presented in simplified form. Other features of the invention will become more fully apparent in the drawings and detailed description presented hereinafter.

DESCRIPTION OF THE PREFERRED EMBODIMENT

Figure 1:
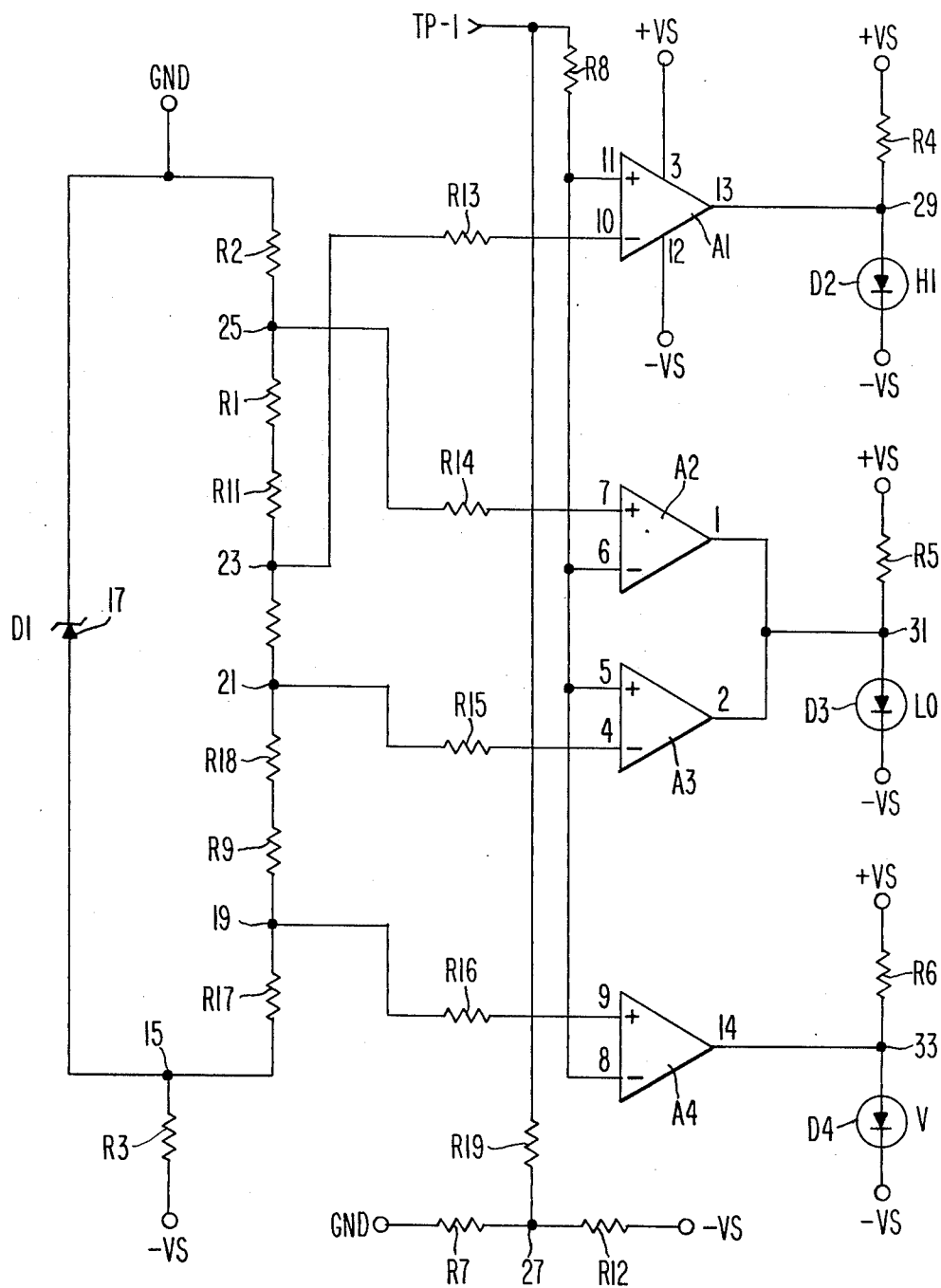
FIG. 1 is a schematic of a preferred circuit embodiment of the present current mode logic probe invention.

The current mode logic probe of the present invention utilizes as display elements three light emitting diodes D2, D3 and D4 and four operational amplifiers A1, A2, A3 and A4, see FIG. 1. As will be described hereinafter, the diodes visually indicate five logic conditions of a voltage level appearing at test point TP1. First, the presence of a HIGH logic level at TP1 is indicated by LED diode D2 being ON and D3 and D4 being OFF. A LOW logic level is indicated by D3 being solely ON. A level being between HIGH and LOW, a MIDRANGE level is indicated by D2 and D3 being ON while D4 is OFF. A level of particular importance to current mode logic is the OPEN level signifying that a current mode logic device under test has its input pin unconnected as measured at the test point TP1. The OPEN level is also used to signify that a pin or testpoint (such as a logic board backplane) is unconnected. The OPEN level condition is indicated by all three diodes D2, D3 and D4 being OFF. A final voltage indicated by the three light emitting diodes D2, D3 and D4 is the SUPPLY VOLTAGE level which is designated by D4 being solely ON.

In the preferred embodiment, the following voltage level indicators signify:
1. HIGH level for TP1 voltages more positive than $-55$ mV.
2. MIDRANGE level for TP1 voltages between $-55$ mV and $-340$ mV.
3. LOW level for TP1 voltages between $-340$ mV and $-600$ mV.
4. OPEN level for TP1 voltages between $-600$ mV and $-1.9$ V.
5. SUPPLY VOLTAGE for TP1 voltages more negative than $-1.9$ V.

In the preferred embodiment, with continued reference to FIG. 1, a series connection of 8 resistors, R2, R1, R11, R10, R18, R9, R17 and R3 is made between a ground terminal GND and a minus supply voltage terminal $-$VS. A zener diode D1 is connected between the terminal GND and the junction 15 between resistors R17 and R3 to provide a stable reference voltage under conditions wherein the minus supply voltage is unregulated. The cathode end 13 of the diode D1 is connected to the terminal GND.

A resistor R16 is connected from the junction 19 of resistors R9 and R17 to the positive input terminal 9 of amplifier A4. Likewise, resistor R15 connects the junction 21 of resistors R10 and R18 to the negative input terminal 4 of amplifier A3, resistor R13 connects the junction 23 of resistors R11 and R10 to the negative input terminal 10 of amplifier A1, and resistor R14 connects the junction 25 of resistors R2 and R1 to the positive input terminal 7 of amplifier A2.

Test point terminal TP1 is connected through resistor R8 to the positive input terminal 11 of amplifier A1, the negative input terminal 6 of amplifier A2, the positive input terminal 5 of amplifier A3 and the negative input terminal 8 of amplifier A4. Test point terminal TP1 is also connected through resistor R19 to the junction 27 of resistors R7 and R12. Resistors R7 and R12 are connected in series between the terminal GND and the minus supply voltage terminal $-$VS.

Current limiting resistor R4 and light emitting diode D2 are connected in series between the positive supply voltage terminal $+$VS and the negative supply voltage terminal −VS. Similarly, connected therebetween is resistor R5 with diode D3, and resistor R6 with diode D4. The output 13 of amplifier A1 is connected to the junction 29 of resistor R4 and diode D2. The output 1 of amplifier A2 and the output 2 of amplifier A3 are connected to the junction 31 of resistor R5 and diode D3. The output 14 of amplifier A4 is connected to the junction 33 of resistor R6 and diode D4.

Although not limited thereto, Table 1 below lists the preferred values for the resistors R1-R19, diodes D1-D3 and amplifiers A1-A4 of the present current mode logic probe invention.

TABLE

| COMPONENT | DESCRIPTION |
| --- | --- |
| A1, A2, A3, A4 | LM339 Quad Comparator |
| D1 | In746A, 3.3V Zener Diode |
| D2-D3 | MV5075B, Red LED |
| D4 | MV5274B, Green LED |
| IC1 | LM339 Quad Comparator |
| R1 | 56Ω, 1/4W, 1% |
| R2 | 590Ω, 1/4W, 1% |
| R3-R7 | 1K, 1/4W, 5% |
| R8 | 1.2K, 1/4W, 1% |
| R9 | 2.00K, 1/4W, 1% |
| R10 | 2.74K, 1/4W, 1% |
| R11 | 3.00K, 1/4W, 1% |
| R12 | 3K, 1/4W, 5% |
| R13-R16 | 4.7K, 1/4W, 5% |
| R17 | 6.80K, 1/4W, 1% |
| R18 | 12.0K, 1/4W, 1% |
| R19 | 1M, 1/4W, 5% |

The values shown in Table 1 were selected for a current mode logic testing environment having a negative supply voltage of 4.8 volts unregulated and a positive supply voltage of +5.0 volts. Voltage reference values obtained are as follows: junction 19, −1.9 V; junction 21, −600 mV; junction 23, −340 mV; and junction 25, −55 mV. The combination of the Zener diode D1, precision resistive values, and quality comparator amplifiers A1-A4 yields stable threshold reference voltages for setting the HIGH, MIDRANGE, LOW, OPEN and SUPPLY VOLTAGE indicating levels. Resistors R8, R13, R14, R15 and R16 provide input protection for the comparators against negative input transistors below the negative supply voltage on the amplifiers A1-A4.

If the voltage level present at TP1 is between −600 mV and −1.9 V an OPEN indication will be given since an unconnected common mode logic circuit input pin will float to approximately −1.2 volts. Also, when TP1 is measuring an unconnected point (such as an unconnected pin on a backplane) resistors R7 and R12 bias the TP1 point to −1.2 volts through R19. In the preferred embodiment, R19 is chosen to be 1 megohm in order to minimize the loading effect of TP1 on the common mode logic circuit under test.

Figure 2:
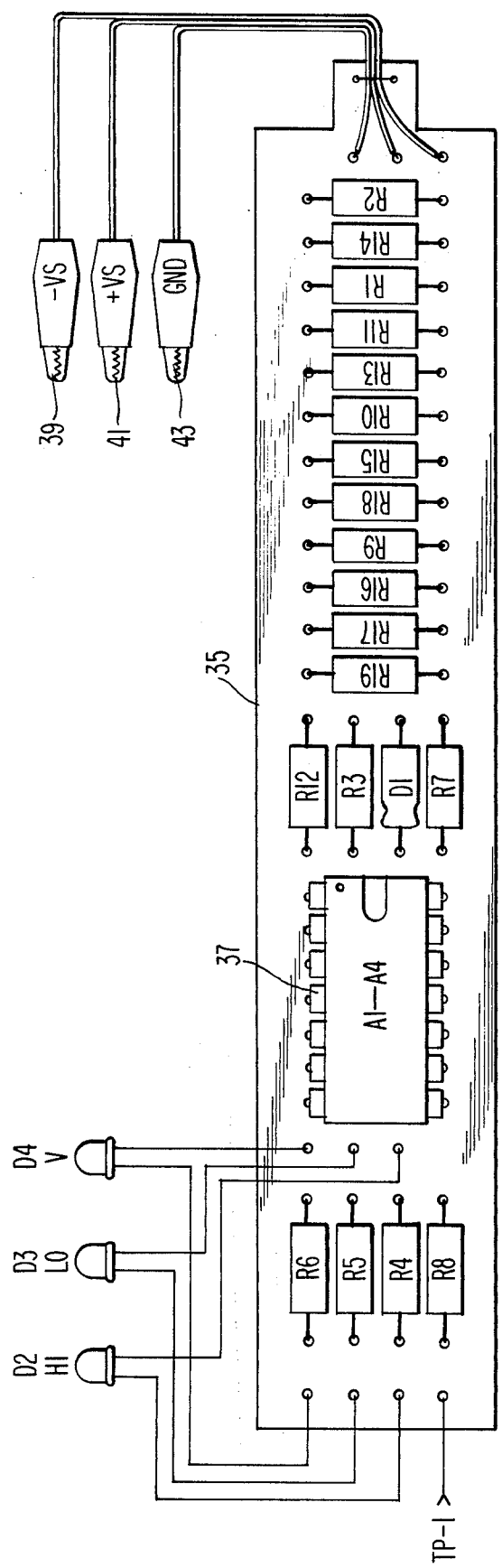
FIG. 2 illustrates the preferred physical layout of components used in the circuit of FIG. 1.

The current mode logic test probe of the present invention may be mounted on a circuit board 35 (either of the printed circuit type or point-to-point variety) for handheld portability. As shown in FIG. 2, the amplifiers A1, A2, A3 and A4 are physically realized in a single integrated circuit package 37, preferably a LM339.

A first alligator type clip 39 is provided to attach to the negative supply voltage, a second clip 41 to attach to the positive supply voltage, and a third clip 43 to provide a ground (GND) connection.

Figure 3:
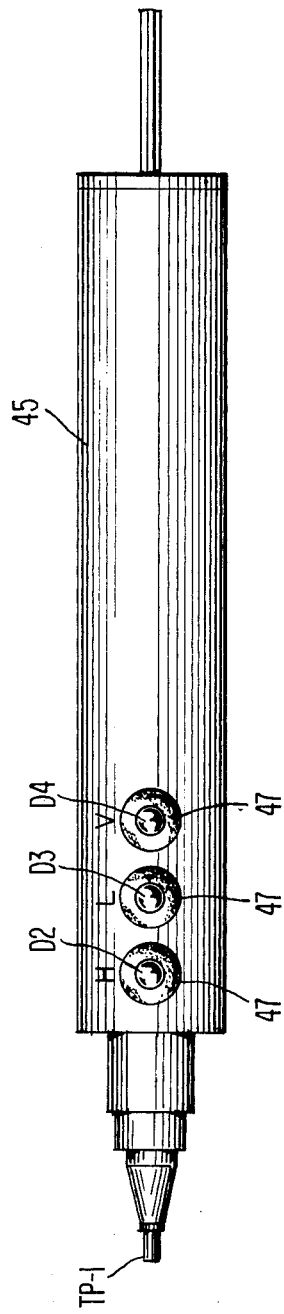
FIG. 3 shows a pen-like housing suitable for enclosing the components of FIG. 2.

The circuit board of FIG. 2 is fashioned to fit into a circular pen-shaped housing 45, see FIG. 3. Grommets 47 are provided for visibly mounting the display light emitting diodes D2, D3 and D4.

While a preferred electrical and physical embodiment of the present invention has been described above, it is obvious to those skilled in the art that many different embodiments of this invention could be made without departing from the scope thereof.

It is intended therefore, that all matter in the above-description be interpreted as illustrative and not in the limiting sense.

What is claimed is:

1. A pen-shaped handheld current mode logic testing probe comprising:
   a voltage level receiving test point;
   high resistance means for biasing said receiving test point to a negative bias voltage level representative of the voltage level of an open circuited current mode logic input;
   stablized reference voltage means for generating a precision first, second, third and fourth threshold voltage level, each threshold voltage level thereof being in order increasing more negative, said third threshold voltage being less negative than said negative bias voltage level of said high resistance means and said fourth threshold voltage level being more negative than said negative bias voltage level of said high resistance means;
   first comparator amplifier means for comparing said second threshold voltage level with voltage levels received at said voltage level receiving test point and for generating an output responsive thereto;
   second comparator amplifier means for comparing said first threshold voltage level with voltage levels received at said voltage level receiving test point and for generating an output responsive thereto;
   third comparator amplifier means for comparing said third threshold voltage level with voltage levels received at said voltage level receiving test point and for generating an output responsive thereto;
   fourth comparator amplifier means for comparing said fourth threshold voltage level with voltage levels received at said voltage level receiving test point and for generating an output responsive thereto;
   first indicating means coupled to said first comparator amplifier means for indicating when voltage levels received at said voltage level receiving test point are relatively more positive than said second threshold voltage level;
   second indicating means coupled to said second and said third comparator amplifier means for indicating when voltage levels received at said voltage level receiving test point are between said first and said third threshold voltage levels; and
   third indicating means coupled to said fourth comparator amplifier means for indicating when voltage levels received at said voltage level receiving test point are relatively more negative than said fourth threshold voltage level.

2. The pen-shaped handheld current mode logic testing probe according to claim 1 wherein said stabilized reference voltage means includes:
   a zener diode; and
   a precision resistor ladder network having four tap points, each tap point providing one of said four threshold voltage levels, said ladder network connected in parallel with said zener diode.

3. The pen-shaped handheld current mode logic testing probe according to claim 1 wherein said first, second, third and fourth comparator amplifier means are fabricated within a single integrated circuit package.

4. The pen-shaped handheld current mode logic testing probe according to claim 1 wherein said first, second and third indicating means each include a light emitting diode.

5. The pen-shaped handheld current mode logic testing probe according to claim 4 wherein said light emitting diode in said first indicating means and said light emitting diode in said second indicating means are both red light emitting diodes, and said light emitting diode in said third indicating means is a green light emitting diode.

6. The pen-shaped handheld current mode logic testing probe according to claim 1 wherein said first threshold voltage level is substantially minus 55 volts, said second threshold level is substantially minus 340 millivolts, said third threshold level is substantially minus 600 millivolts and said fourth threshold level is substantially minus 1.9 volts.

7. The pen-shaped handheld current mode logic testing probe according to claim 6 wherein said reference voltage means includes:
a zener diode; and
a precision resistor ladder network having four tap points, each tap point providing one of said four threshold voltage levels, said ladder network connected in parallel with said zener diode.

8. The pen-shaped handheld current mode logic testing probe according to claim 1 wherein said high resistance means for biasing is coupled to said voltage level receiving test point through a resistor having substantially 1 megohm resistance.

* * * * *